(12) United States Patent
Mazzillo et al.

(10) Patent No.: US 9,299,873 B2
(45) Date of Patent: Mar. 29, 2016

(54) AVALANCHE PHOTODIODE OPERATING IN GEIGER MODE INCLUDING A STRUCTURE FOR ELECTRO-OPTICAL CONFINEMENT FOR CROSSTALK REDUCTION, AND ARRAY OF PHOTODIODES

(71) Applicant: STMicroelectronics S.r.l., Agrate Brianza (IT)

(72) Inventors: Massimo Cataldo Mazzillo, Corato (IT); Anna Muscara', Patti (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 199 days.

(21) Appl. No.: 14/270,760

(22) Filed: May 6, 2014

(65) Prior Publication Data

US 2014/0339398 A1   Nov. 20, 2014

(30) Foreign Application Priority Data

May 16, 2013  (IT) .............................. TO2013A0398

(51) Int. Cl.
   *H01L 31/107*  (2006.01)
   *H01L 27/144*  (2006.01)

(52) U.S. Cl.
   CPC .......... *H01L 31/107* (2013.01); *H01L 27/1446* (2013.01)

(58) Field of Classification Search
   CPC .......................... H01L 31/107; H01L 27/1446
   USPC ......................................................... 250/207
   See application file for complete search history.

(56) References Cited

U.S. PATENT DOCUMENTS

| 6,870,239 B1* | 3/2005 | Clark | ................... | H01L 31/107 257/438 |
| 7,341,921 B2* | 3/2008 | Jackson | ............... | H01L 31/107 257/186 |
| 8,264,019 B2* | 9/2012 | Mazzillo | .......... | H01L 27/14643 257/284 |
| 2009/0184384 A1 | 7/2009 | Sanfilippo et al. | | |

OTHER PUBLICATIONS

IT Search Report and Written Opinion for IT TO2013A000398 mailed Mar. 5, 2014 (7 pages).

* cited by examiner

*Primary Examiner* — Seung C Sohn
(74) *Attorney, Agent, or Firm* — Gardere Wynne Sewell LLP

(57) ABSTRACT

An avalanche photodiode includes a cathode region and an anode region. A lateral insulating region including a barrier region and an insulating region surrounds the anode region. The cathode region forms a planar optical guide within a core of the cathode region, the guide being configured to guide photons generated during avalanche. The barrier region has a thickness extending through the planar optical guide to surround the core and prevent propagation of the photons beyond the barrier region. The core forms an electrical-confinement region for minority carriers generated within the core.

21 Claims, 6 Drawing Sheets

AVALANCHE PHOTODIODE OPERATING IN GEIGER MODE INCLUDING A STRUCTURE FOR ELECTRO-OPTICAL CONFINEMENT FOR CROSSTALK REDUCTION, AND ARRAY OF PHOTODIODES

PRIORITY CLAIM

This application claims priority from Italian Application for Patent No. TO2013A000398 filed May 16, 2013, the disclosure of which is incorporated by reference.

TECHNICAL FIELD

The present invention relates to an avalanche photodiode operating in Geiger mode, which includes a structure for electro-optical confinement designed to limit crosstalk. Moreover, the present invention regards an array of photodiodes.

BACKGROUND

In the technical field of photon detection, the so-called avalanche photodiodes operating in Geiger mode (GMAPs) are known, which enable detection of individual photons.

An avalanche photodiode operating in Geiger mode, also known as single-photon avalanche diode (SPAD), is formed by an avalanche photodiode APD. Hence, it comprises a junction made of semiconductor material, which has a breakdown voltage $V_B$ and is biased, in use, with reverse-biasing voltage $V_A$ higher in modulus than the breakdown voltage $V_B$, which, as is known, depends upon the semiconductor material and upon the doping level of the least doped region of the junction itself. In this way, the junction has a particularly extensive depleted region, present inside which is a non-negligible electrical field. Hence, generation of a single electron-hole pair, caused by absorption within the depleted region of a photon impinging on the SPAD, may be sufficient to trigger an ionization process. This ionization process in turn causes an avalanche multiplication of the carriers, with gains of around $10^6$, and consequent generation in a short time (a few hundreds of picoseconds) of the so-called avalanche current, or more precisely of a pulse of the avalanche current.

The avalanche current can be collected, typically by means of an external circuitry connected to the junction, for example by means of appropriate anode and cathode electrodes, and represents an output signal of the SPAD, which will be also referred to as "output current". In practice, for each photon absorbed, a pulse of the output current of the SPAD is generated.

The fact that the reverse-biasing voltage $V_A$ is appreciably higher than the breakdown voltage $V_B$ causes the avalanche-ionization process, once triggered, to be self-sustaining Consequently, once triggered, the SPAD is no longer able to detect photons, with the consequence that, in the absence of appropriate remedies, the SPAD manages to detect arrival of a first photon, but not arrival of subsequent photons.

To be able to detect also the subsequent photons, it is necessary to quench the avalanche current generated within the SPAD, arresting the avalanche-ionization process, and in particular lowering, for a period of time known as "hold-off time", the effective voltage $V_e$ across the junction so as to inhibit the ionization process. For this purpose, use of so-called quenching circuits, whether of an active or passive type, is known. Next, the reverse-biasing voltage $V_A$ is restored in order to enable detection of a subsequent photon.

This being said, the timing of response of the SPAD, i.e., the time required for generating an output current pulse following upon absorption of a photon, is affected principally by four factors: the time for collecting the carriers within the depleted region, typically of the order of a few picoseconds per micron of depleted region; the time of propagation of the avalanche, i.e., the time required for the entire junction to be brought into the breakdown region, typically of the order of a few tens of picoseconds; the time of diffusion of the carriers generated in the non-depleted region of the junction through the non-depleted region itself, typically comprised between a few tens of picoseconds and a few nanoseconds; and the drift time proper, for collection of the carriers at the electrodes.

In connection with the time of diffusion of the carriers through the non-depleted region, it should be noted that not only both of the carriers of each electron-hole pair generated following upon absorption of a photon within the depleted region concur to the generation of the output current. In fact, given the reverse biasing of the junction, to the generation of the output current there concur also the minority carriers of the electron-hole pairs generated following upon absorption of a photon outside the depleted region, hence in a non-depleted, i.e., quasi neutral, region.

For example, assuming a junction of a PN type with the P region arranged, with respect to the direction of propagation of the photons, upstream of the N region, there may contribute to the output current both the electrons of the electron-hole pairs generated in the quasi-neutral portion of the P region of the junction (also known as "dead layer") and the holes of the electron-hole pairs generated in the quasi-neutral portion of the N region of the junction (generally known as "epilayer"). The set of the portions of the SPAD in which generation of carriers can take place following upon absorption of photons is known in general as "active area".

In practice, in the present description the term "minority carriers" is used to indicate carriers that are minority carriers in the point in which they are generated following upon absorption of a photon. For example, assuming again a region of a P type, an electron of an electron-hole pair generated following upon absorption of a photon in this P region is a minority carrier, whereas the corresponding hole is a majority carrier.

Likewise, assuming a region of an N type, a hole of an electron-hole pair generated following upon absorption of a photon in this N region is a minority carrier, whereas the corresponding electron is a majority carrier.

This said, the aforementioned minority carriers can cause generation of corresponding output current pulses, in the case where they manage to diffuse until they reach the depleted region, without first recombining.

However, even though also the minority carriers of the electron-hole pairs generated outside the depleted region can contribute to photon detection, they require, in order to be able to reach the depleted region, diffusion times that can range (according to the point of generation and the doping level) between a few tens of picoseconds and a few nanoseconds. Consequently the carriers generated in the avalanche events triggered by them can be collected at the anode and cathode electrodes with considerable delays. As a result, there is a deterioration of the response time of the SPAD. In particular, the so-called diffusion tails are generated in the output current.

Similar considerations may be made regarding a so-called SPAD array, and in particular, a so-called silicon photomultiplier (SiPM).

In detail, a SiPM is formed by an array of SPADs grown on one and the same substrate and provided with respective quenching resistors (for example, of a vertical type) integrated in the SPADs themselves, these quenching resistors being uncoupled from one another and independent. Moreover, the anode and cathode electrodes of all the SPADs are configured so that they can be connected to a single voltage generator. In other words, the anode electrodes of all the SPADs are multiplexed with one another; likewise, the cathode electrodes of all the SPADs are multiplexed with one another. Consequently, the SPADs of the SiPM can be biased at one and the same reverse-biasing voltage $V_A$; moreover, the avalanche currents generated within them are multiplexed together so as to generate an output signal of the SiPM equal to the summation of the output signals of the SPADs.

In practice, the SiPM is a device having a wide area and a high gain, capable of supplying, on average, an electrical output signal (current) proportional to the number of photons that impinge upon the SiPM. However, SiPMs present the same drawbacks as the SPADs that form them.

Moreover, the SiPM, as on the other hand also a generic array of SPADs grown on one and the same substrate, and the anode and cathode electrodes of which are not multiplexed with one another, is affected by crosstalk.

In detail, given any SPAD, the corresponding operation is inevitably affected by charge carriers generated in surrounding SPADs and by photons generated by electroluminescence during processes of avalanche multiplication triggered in surrounding SPADs.

In greater detail, it may be noted that SPADs operating above the breakdown voltage emit secondary photons as a result of electroluminescence, on account of various mechanisms, such as for example intraband recombination. The secondary photons are emitted generally within a range of wavelengths comprised between 400 nm and 2 µm, with a probability of emission that depends upon the reverse-biasing voltage $V_A$ applied.

The secondary photons can propagate and subsequently be absorbed in the depleted regions of the junctions of SPADs different from the SPADs in which they have been generated, triggering avalanche events, in which case they give rise to the so-called "prompt crosstalk" phenomenon, which manifests itself on time scales of the order of a few tens of picoseconds.

It is likewise possible for the secondary photons to be absorbed within quasi-neutral regions of SPADs different from the SPADs in which they have been generated, triggering avalanche events in these photodiodes, in which case they give rise to the so-called "delayed crosstalk" phenomenon, which manifests itself on time scales of the order of a few nanoseconds. The different time scale with respect to prompt crosstalk is explained by the fact that, given a secondary photon emitted in a first SPAD, the absorption of this secondary photon within the quasi-neutral region of a second SPAD leads to generation of a pair of carriers, one of which can effectively trigger an avalanche process in the second SPAD, but only after reaching the depleted region of the second SPAD.

In particular, the secondary photons that most concur to the phenomenon of delayed crosstalk are the ones with wavelengths comprised between 700 nm and 1100 nm, because, in this range of wavelengths, the coefficient of absorption of silicon is particularly low, and consequently these secondary photons can cover long distances before being absorbed.

To the phenomenon of delayed crosstalk there also concur the charge carriers that, after being generated within the quasi-neutral regions of SPADs, diffuse until they reach the depleted regions of SPADs different from the SPADs in which they were generated. On the other hand, these carriers can likewise reach the depleted regions of the same SPADs in which they have been generated, in which case they give rise to the so-called "afterpulsing" phenomenon.

In practice, the crosstalk causes electro-optical coupling between the SPADs of the SiPMs. Consequently, the crosstalk increases the total noise of the SiPM, especially in the case where the SiPM has large dimensions and is subject to a high reverse-biasing voltage $V_A$. As a result, the sensitivity of the SiPM is limited; moreover, the probability of saturating the SiPM increases, since a certain number of SPADs is turned on owing to crosstalk, even in the absence of an external luminous flux.

In order to limit the crosstalk, and in particular in order to limit prompt crosstalk, the technique is known of forming, within each SPAD, a trench filled with metal material, which delimits the active area, as described for example in United State Patent Application Publication No. 2009/0184384, the disclosure of which is incorporated by reference.

As described in the document European Patent No. 1755171, the disclosure of which is incorporated by reference, likewise is known the technique of forming grooves of a substantially triangular shape around the active area of each SPAD, these grooves being coated with metal material. Given a SPAD, the grooves that surround it absorb possible secondary photons emitted by the given SPAD in directions roughly parallel to the surface of the given SPAD exposed to the luminous flux. In this way, a reduction of prompt crosstalk is obtained.

Moreover, given a SPAD, and considering the quasi-neutral region of the lower portion of the junction of this SPAD, the technique is known of forming an additional junction within the SPAD, arranged underneath the main junction and reverse biased in order to prevent the minority carriers that are generated in this quasi-neutral region from reaching the junctions of surrounding SPADs, with consequent reduction of delayed crosstalk. An example of this technique is described in United States Patent Application Publication No. 2011/0241149, the disclosure of which is incorporated by reference. This technique thus envisages providing, for each SPAD, three electrical terminals in order to bias the main junction and the underlying additional junction correctly. This leads to an increase in the complexity and a reduction in the so-called fill factor of the SiPM since part of the surface exposed to the luminous flux is coated with two metal layers.

As regards in particular the reduction of the delayed crosstalk, likewise known are photomultipliers of the type described in the document PCT Application No. WO2011/132025, the disclosure of which is incorporated by reference. In detail, according to PCT Application No. WO2011/132025, each photodiode comprises a layer of amorphous silicon, which is arranged underneath the respective junction and has been created by means of ion bombardment of epitaxial silicon. In this way, each photodiode comprises a region with high efficiency of absorption of photons having wavelengths in the infrared. However, the creation of the amorphous layer by means of ion bombardment may cause an increase in the defectiveness within the active area.

In addition, as described in PCT Application No. WO2012/083983, the disclosure of which is incorporated by reference, techniques of treatment of the substrate are known that enable a reduction of the number of photons that are reflected on the bottom surface of each SPAD, with consequent reduction of delayed crosstalk. Also in this case, however, the active area can present a certain defectiveness. Moreover, the contribution to the delayed crosstalk due to carriers generated by absorption of the photon, before the latter reach the bottom surfaces of the SPADs, is not reduced.

There is a need in the art to provide an avalanche photodiode operating in Geiger mode that will enable the drawbacks of the known art to be at least partially overcome.

SUMMARY

According to an embodiment, an avalanche photodiode comprises: a body of semiconductor material having a first surface and a second surface, said body including: a cathode region of a first type of conductivity, forming the first and second surfaces; and an anode region of a second type of conductivity, extending within the cathode region and contacting the cathode region along an interface. The photodiode further includes a lateral insulating region extending through the body starting from the first surface and surrounding the anode region and at least part of the cathode region. The lateral insulating region comprises: a barrier region; and an insulating region which surrounds the barrier region. The cathode region forms an optical guide of a planar type comprising a core region which is arranged between the interface and the second surface and which extends between a minimum depth and a maximum depth and is designed to guide photons. The barrier region extends with a thickness at least equal to said maximum depth so as to surround the core region laterally, and is configured to prevent propagation beyond the barrier region of at least part of the photons coming, in use, from the core region and impinging upon the barrier region. The core region forms an electrical-confinement region for minority carriers generated within the core region.

In an embodiment, an apparatus comprises an array of photodiodes of the type described above.

In an embodiment, an integrated circuit comprises: a cathode region of a first type of conductivity; an anode region of a second type of conductivity in contact with the cathode region; said cathode and anode forming an avalanche photodiode; wherein the cathode region includes, underneath the anode region, a planar optical waveguide configured to guide photons generated in response actuation of the avalanche photodiode; and an insulating region formed in the cathode region surrounding the anode region and passing through the planar optical waveguide, said insulating region configured to prevent propagation of said photons beyond said insulating region.

BRIEF DESCRIPTION OF THE DRAWINGS

For a better understanding of the invention, embodiments thereof are now described, purely by way of non-limiting example and with reference to the attached drawings, wherein.

DETAILED DESCRIPTION OF THE DRAWINGS

Figure 1:
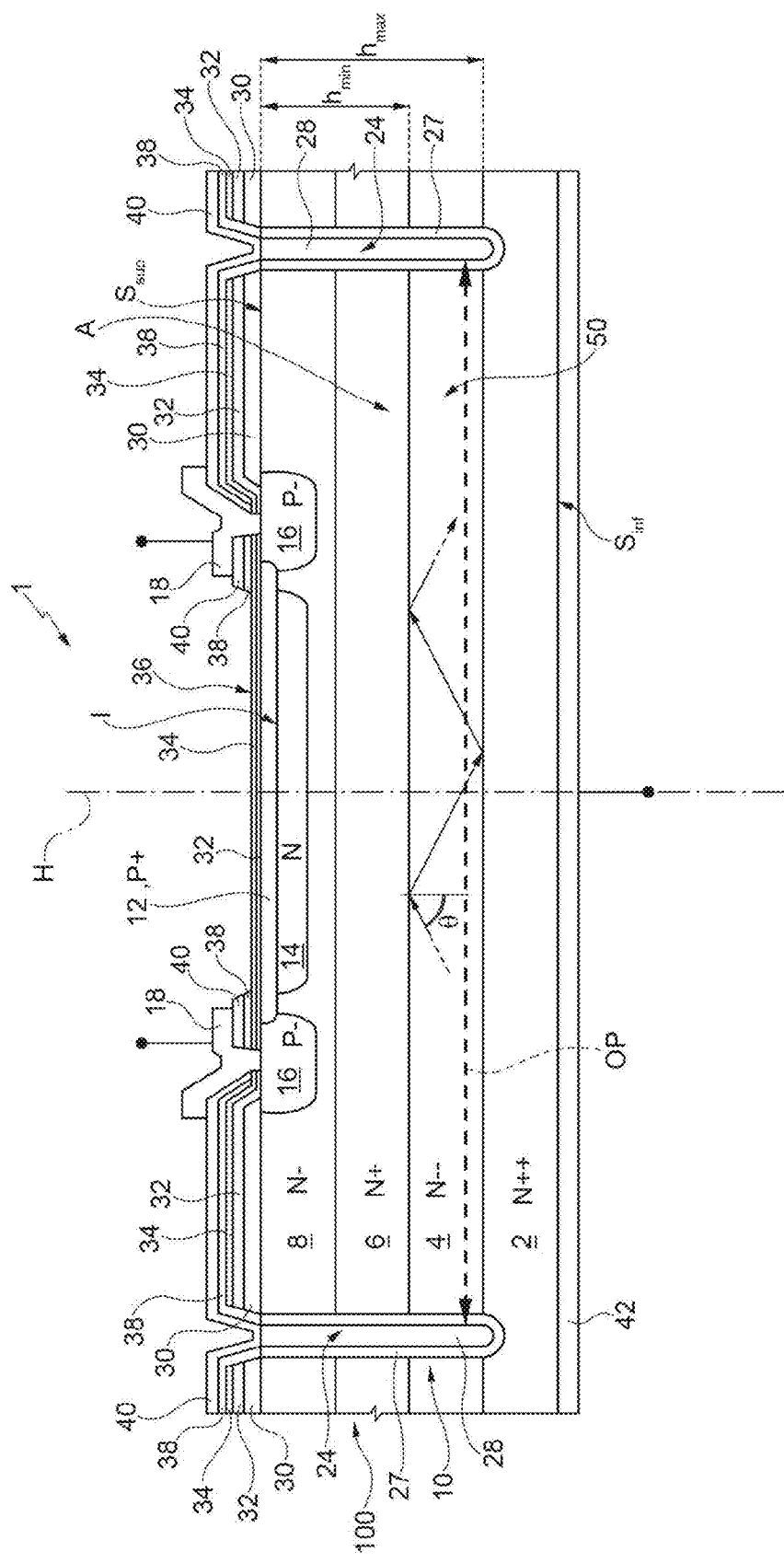
FIGS. 1 and 4 show cross sections of embodiments of the present photodiode.
Figure 2:
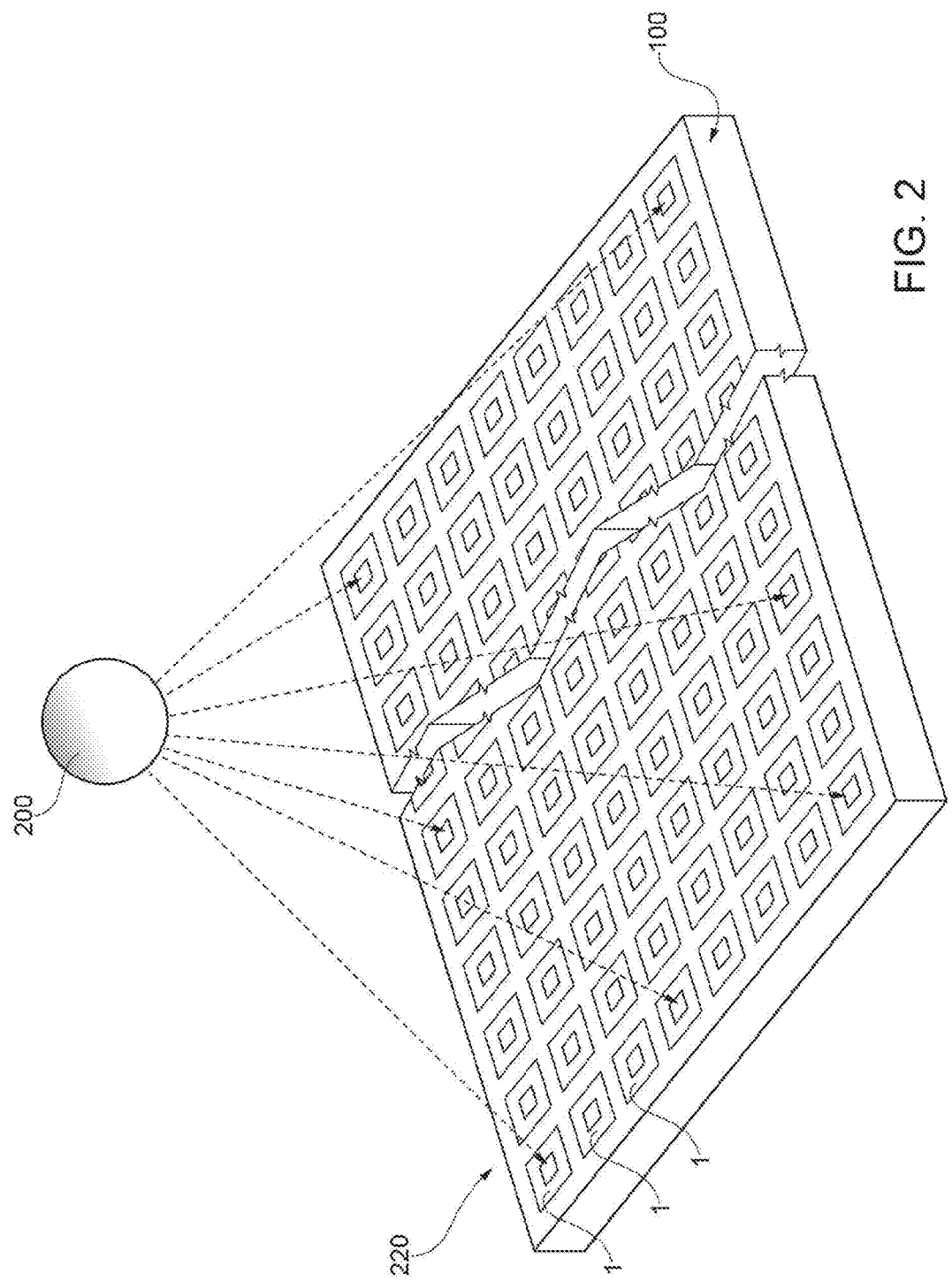
FIG. 2 is a schematic view of an array of photodiodes during use.

FIG. 1 shows an embodiment of a photodiode 1 of the avalanche type operating in Geiger mode. The photodiode 1 may belong, for example, to an array 220 of photodiodes 1, as illustrated in FIG. 2, where also a light source 200 is represented. The array 220 may comprise any number of photodiodes 1, according to the need.

To return to FIG. 1, the photodiode 1 is integrated in a die 100 that includes a substrate 2 of semiconductor material, of an N++ type and having a bottom surface $S_{inf}$. Moreover, the photodiode 1 includes a first epitaxial layer 4, a second epitaxial layer 6, and a third epitaxial layer 8. In FIG. 1, as on the other hand also in the subsequent FIG. 3, the thicknesses of the substrate 2 and of the first, second, and third epitaxial layers 4, 6, 8 are not in scale.

The substrate 2 is of an N++ type, has a thickness comprised, for example, between 300 µm and 500 µm, and has a doping level comprised, for example, between $1 \cdot 10^{19}$ cm$^{-3}$ and $5 \cdot 10^{20}$ cm$^{-3}$.

The first epitaxial layer 4 is of an N-- type, has a thickness comprised, for example, between 5 µm and 10 µm and overlies the substrate 2, in direct contact therewith. Moreover, the first epitaxial layer 4 has a doping level comprised, for example, between $1 \cdot 10^{14}$ cm$^{-3}$ and $5 \cdot 10^{14}$ cm$^{-3}$.

The second epitaxial layer 6 is of an N+ type, has a thickness comprised, for example, between 2 µm and 5 µm and overlies the first epitaxial layer 4, with which it is in direct contact. Moreover, the second epitaxial layer 6 has a doping level comprised, for example, between $1 \cdot 10^{18}$ cm$^{-3}$ and $5 \cdot 10^{19}$ cm$^{-3}$.

The third epitaxial layer 8 is of an N− type, has a thickness comprised, for example, between 2 µm and 5 µm and overlies the second epitaxial layer 6, in direct contact therewith. Moreover, the third epitaxial layer 8 forms a top surface $S_{sup}$. The doping level of the third epitaxial layer 8 is comprised, for example, between $5 \cdot 10^{15}$ cm$^{-3}$ and $1 \cdot 10^{16}$ cm$^{-3}$.

The substrate 2 and the first, second, and third epitaxial layers 4, 6, 8 form a body 10 of semiconductor material, delimited by the top surface $S_{sup}$ and by the bottom surface $S_{inf}$. In what follows it is assumed, without this implying any loss of generality, that the semiconductor body 10 is made of silicon. In addition, the first epitaxial layer 4 extends within the body 10 with a depth of not less than $h_{min}$ and not more than $h_{max}$, this depth being measured starting from the top surface $S_{sup}$.

An anode region 12, of a P+ type and circular or polygonal (for example, quadrangular) in shape, faces the top surface $S_{sup}$ and extends within the third epitaxial layer 8. In particular, the anode region 12 has a thickness comprised, for example, between 0.1 µm and 0.5 µm. In addition, the anode region 12 has a doping level comprised, for example, between $1 \cdot 10^{19}$ cm$^{-3}$ and $1 \cdot 10^{20}$ cm$^{-3}$.

An enriched region 14, of an N type, extends in the third epitaxial layer 8, underneath, and in direct contact with, the anode region 12. In top plan view, the enriched region 14 has a circular or polygonal (for example, quadrangular) shape. In addition, the enriched region 14 has a thickness of, for example, 1 µm and a doping level comprised, for example, between $1 \cdot 10^{16}$ cm$^{-3}$ and $5 \cdot 10^{16}$ cm$^{-3}$.

For practical purposes, the anode region 12 and the enriched region 14 form a first PN junction, which is designed to receive photons and generate the avalanche current, as described in detail hereinafter. In other words, the anode region 12 and the enriched region 14 are in contact with one another along an interface surface I.

The enriched region 14 and the third epitaxial layer 8 have, instead, the purpose of confining a high electrical field in the proximity of the first PN junction, thus reducing the breakdown voltage $V_B$ of the junction itself.

A circular guard ring 16 of a P− type with a doping level comprised between $1 \cdot 10^{16}$ cm$^{-3}$ and $3 \cdot 10^{16}$ cm$^{-3}$ extends in the third epitaxial layer 8. In particular, the guard ring 16 faces the top surface $S_{sup}$ and is arranged on the outside of the anode region 12, with which it is in direct contact. Moreover, the guard ring 16 has a thickness comprised, for example, between 1 μm and 3 μm.

The guard ring 16 forms a second PN junction with the third epitaxial layer 8 so as to prevent edge breakdown of the anode region 12. Moreover, the guard ring 16 is in direct electrical contact with an anode metallization 18, by means of which it is possible to bias the first PN junction. In particular, it is possible to apply to the anode metallization 18 a reverse-biasing voltage $V_A$ higher, in modulus, than the breakdown voltage $V_B$ of the first PN junction.

In practice, the types of the anode region 12 and of the guard ring 16, and hence the corresponding doping levels, are such that the depletion region that is present astride of the interface between regions of a P type (anode region 12 and guard ring 16) and regions of an N type (enriched region 14 and third epitaxial layer 8) extends principally in the guard ring 16, rather than in the anode region 12, preventing the interface between the anode region 12 (semiconductor) and the oxide layers present on the anode region 12 (described hereinafter) from possibly concentrating a high electrical field, thus reducing the dark current of the photodiode 1. In fact, this interface is rich in Shockley-Read-Hall (SRH) centers. Consequently, it is expedient to limit the electrical fields in its proximity to prevent an undesirable increase of the dark current of the photodiode 1.

The photodiode 1 further comprises a lateral insulating region 24, which is arranged on the outside of the guard ring 16 and extends, starting from the top surface $S_{sup}$, within the semiconductor body 10.

The lateral insulating region 24 has, in top plan view, a circular or polygonal shape. Moreover, the lateral insulating region 24 laterally surrounds the active area A.

In detail, the lateral insulating region 24 comprises a channel-stopper region 27 arranged more externally, made of dielectric material (for example, oxide) and arranged in direct contact with the semiconductor body 10, as well as a barrier region 28, made of polysilicon, which is surrounded by the channel-stopper region 27, with which it is in direct contact.

Moreover, the barrier region 28 is in direct contact with a dielectric layer described in detail hereinafter and referred to as "fourth dielectric layer 40".

In greater detail, the polysilicon that forms the barrier region 28 can have a doping either of an N type or of a P type and has a doping level comprised, for example, between $1 \cdot 10^{19}$ cm$^{-3}$ and $5 \cdot 10^{20}$ cm$^{-3}$. Moreover, for wavelengths comprised between 700 nm and 1100 nm, the polysilicon of the barrier region 28 has a coefficient of absorption of approximately $5 \cdot 10^4$ cm$^{-1}$.

This being said, the barrier region 28 extends, starting from the top surface $S_{sup}$, with a thickness at least equal to the aforementioned depth $h_{max}$. Consequently, the lateral insulating region 24, in addition to traversing the first, second, and third epitaxial layers 4, 6 8, extends at least in part in the substrate 2. The active area A is hence formed by portions of the anode region 12, of the enriched region 14, and of the first, second, and third epitaxial layers 4, 6, 8.

In addition, the barrier region 28 has a width, measured along any direction parallel to the top surface $S_{sup}$, at least equal to 1 μm, in such a way that the barrier region 28 is able to absorb at least 99% of the photons that have wavelengths comprised between 700 nm and 1100 nm and that propagate in the first epitaxial layer 4 in directions parallel to the top surface $S_{sup}$, until they impinge upon the barrier region 28 itself.

Present on top of a peripheral portion of the top surface $S_{sup}$, laterally staggered with respect to the anode region 12, is a first dielectric layer 30, made, for example, of thermal oxide. The first dielectric layer 30 extends partially on top of the guard ring 16.

A second dielectric layer 32, made, for example, of TEOS oxide, extends over the first dielectric layer 30, with which it is in direct contact, as well as over the anode region 12, with which it is in direct contact. The second dielectric layer 32 extends in part also over a portion of the guard ring 16, with which it is in direct contact.

A coating layer 34, made, for example, of nitride, extends over the second dielectric layer 32 and provides, together with the latter, a double anti-reflection coating (DLARC) 36.

By appropriately modulating, in a way in itself known, the thickness of the second dielectric layer 32 and of the coating layer 34, it is possible to optimize the anti-reflection coating 36, in such a way that it will be transparent only for a specific range of wavelengths, and reflectant for wavelengths outside said range. It is thus possible to obtain that the photodiode 1 will be sensitive only to some frequencies of the light spectrum.

A third dielectric layer 38, made, for example, of TEOS oxide and forming a single layer with the channel-stopper region 27, extends over the coating layer 34, with which it is in direct contact, without, however, overlying a central portion of the anode region 12. In other words, the third dielectric layer 38 is laterally staggered with respect to the anode region 12 and the underlying enriched region 14.

The aforementioned fourth dielectric layer 40, which is made, for example, of TEOS oxide, extends over the third dielectric layer 38, with which it is in direct contact. Moreover, the fourth dielectric layer 40 extends until it closes the lateral insulating region 24 at the top. In particular, the fourth dielectric layer 40 extends until it comes into contact with the barrier region 28.

In practice, the anode metallization 18 traverses the second, third, and fourth dielectric layers 32, 38, 40 so as to contact the guard ring 16, as mentioned previously.

A cathode metallization 42, made of metal material, extends underneath the bottom surface $S_{inf}$ of the substrate 2, with which it is in direct contact. In this way, given the arrangement of the anode metallization 18, the avalanche current flows in the direction of an axis H, perpendicular to the bottom surface $S_{inf}$ and to the top surface $S_{sup}$.

For practical purposes, the enriched region 14, the substrate 2 and the first, second, and third epitaxial layers 4, 6, 8 form a cathode region. Moreover, within the substrate 2, the voltage drop due to the passage of the avalanche current is negligible on account of the low resistivity of the substrate 2. Consequently, within the cathode region, the first, second, and third epitaxial layers 4, 6, 8 form a vertical integrated quenching resistor, which is electrically connected between the anode region 12 and the substrate 2, and is able to quench the avalanche current generated following upon absorption of a photon.

As regards, instead, the lateral insulating region 24, it enables, by means of the barrier region 28, optical insulation of the photodiodes 1 of the array 220.

In particular, the barrier region 28 of the lateral insulating region 24 enables reduction of prompt crosstalk. In addition, the oxide present in the channel stopper 27 guarantees electrical insulation between the photodiodes 1 of the array 220, rendering the quenching resistors independent of one another.

It may moreover be noted that, since the lateral insulating region 24 extends as far as the substrate 2, and given the low resistivity of the substrate 2, turning-on of a photodiode 1 does not alter, to a first approximation, biasing of the adjacent photodiodes 1. Consequently, the array 220 of photodiodes 1 forms a semiconductor photomultiplier (SiPM), where the photodiodes 1 work substantially in the same operating conditions. In this connection, even though not shown, the anode and cathode metallizations of the photodiodes 1 of the array 220 are configured so that they can be connected all to a single voltage generator, which supplies the reverse-biasing voltage $V_A$.

In greater detail, thanks to the structure of the semiconductor body 10 and to the characteristics of the barrier region 28, the delayed crosstalk is particularly limited, for the reasons described hereinafter, with reference to FIG. 3.

Figure 3:
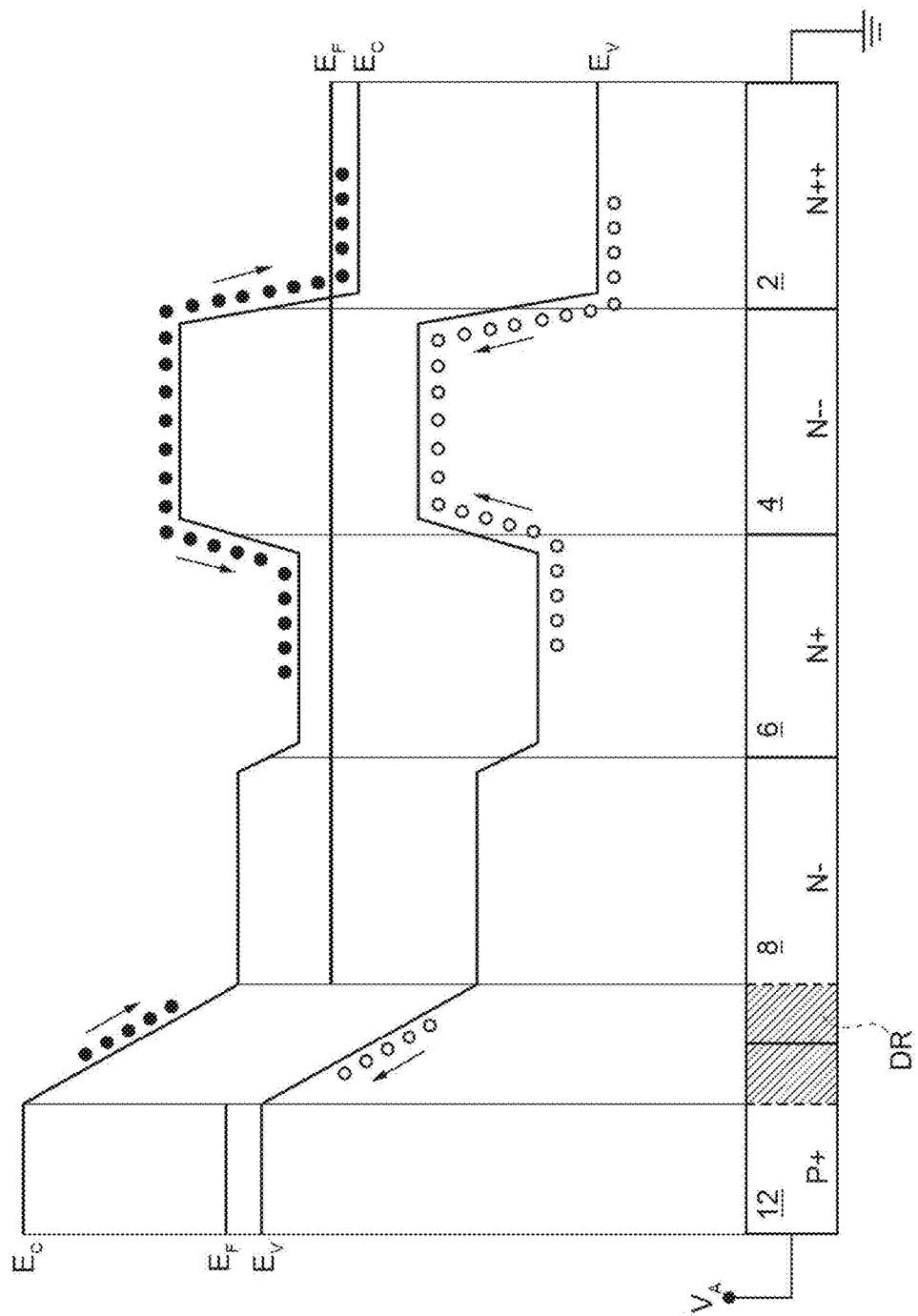
FIGS. 3 and 5 are schematic illustrations of band diagrams for portions of the embodiments illustrated in FIGS. 1 and 4, respectively.

In particular, FIG. 3 shows the band diagram of the semiconductor body 10, when the photodiode 1 is subjected to the reverse-biasing voltage $V_A$, which is concentrated across the aforementioned first PN junction. It is moreover assumed that the cathode region, i.e., the substrate 2 and the first, second, and third epitaxial layers 4, 6, 8, are in thermal equilibrium. It is consequently assumed that, within the cathode region, the Fermi level is constant. Moreover, for reasons of simplicity of presentation, it is assumed that the enriched region 14 is absent, and hence that the anode region 12 forms the first PN junction (the depleted region of which is designated by DR) with the third epitaxial layer 8.

In the above conditions, within the depleted region DR of the first PN junction, there occurs emission by electroluminescence of photons in the infrared, in a substantially isotropic way. Referring to these photons in the infrared as "secondary photons", the majority of them are absorbed within the substrate 2 and in the first epitaxial layer 4. In any case, given the reverse biasing to which the first PN junction is subjected, the only carriers that, after being generated within the cathode region by absorption of secondary photons, can concur in triggering avalanche events are the holes.

This being said, the doping levels of the substrate 2 and of the first and second epitaxial layers 4, 6 are such that within the first epitaxial layer 4 a potential well is formed, i.e., a region of electrical confinement, for the holes. Consequently, holes generated within the cathode region tend to flow towards the potential well, where they remain trapped and thermalize, i.e., evolve towards higher energy levels, without triggering any spurious avalanche events either in photodiodes adjacent to the photodiode 1 or in the photodiode 1 itself. In addition, the high doping levels of the substrate 2 and of the second epitaxial layer 6 enable reduction of the mean lifetime of the holes, on account of the high recombination factor, thus reducing further the probability of triggering spurious avalanche events.

In addition, the substrate 2 and the first and second epitaxial layers 4, 6 form an optical guide 50 of a planar type ("slab waveguide"), designed to confine electromagnetic radiation within the first epitaxial layer 4. In fact, it is known that, as the doping level increases, the refractive index of silicon decreases. Consequently, the first epitaxial layer 4 forms a sort of core with high refractive index, surrounded at the top and at the bottom by two coatings with low refractive indices, which are formed, respectively, by the substrate 2 and by the second epitaxial layer 6. Moreover, the core is surrounded laterally, for its entire thickness, by the barrier region 28, from which it is physically separated by just the channel stopper 27.

In practice, the optical guide 50 forms part of an optical path OP, which extends between a first portion and a second portion of the barrier region 28 and is of a substantially guided type, but for portions that extend within the channel stopper 27. In addition, the core of the optical guide 50, i.e., the first epitaxial layer 4, has a thickness, measured parallel to the axis H, that is substantially constant, in any direction parallel to the bottom surface $S_{inf}$ and to the top surface $S_{sup}$.

In use, part of the photons that are generated within the first epitaxial layer 4 and part of the photons that, albeit coming from regions external to the first epitaxial layer 4, penetrate within the first epitaxial layer 4, are guided by the optical guide 50 towards the barrier region 28, where they can be absorbed, without penetrating within surrounding photodiodes. In particular, the mechanism of coupling of the photons to the optical guide 50 is of a type in itself known and is such that, assuming for simplicity that the substrate 2 and the second epitaxial layer 6 have the same refractive index, a photon propagates in a guided way within the optical guide 50 if it has a direction of propagation such that, in impinging on a coating of the core, it forms an angle $\theta$ wider than the so-called critical angle $\theta_c$. In this case, the photon experiences the phenomenon of total reflection.

In practice, a part of the secondary photons is coupled to the optical guide 50 and is then absorbed by the barrier region 28, without causing generation of carriers that concur in delayed crosstalk, with evident benefits in terms of reduction of the latter phenomenon.

In connection with the barrier region 28, in the embodiment illustrated in FIG. 1, as on the other hand also in the embodiments described hereinafter, the barrier region 28, instead of being made of polysilicon, may be made of any material (for example, titanium nitride) that is able to absorb the secondary photons emitted by electroluminescence, the coefficient of absorption of this absorbent material and the aforementioned width of the barrier region 28 being such that at least 99% of the secondary photons having wavelengths comprised between 700 nm and 1100 nm and directions of propagation parallel to the top surface $S_{sup}$ are absorbed.

It is likewise possible for the barrier region 28 to be made of metal material, such as for example tungsten. In this case, the secondary photons are reflected by the barrier region 28, in a way substantially independent of the width of the barrier region 28, which can hence have any width. Also this case, the secondary photons do not penetrate within surrounding photodiodes, but rather remain inside the waveguide 50, until they are absorbed. The carriers thus generated in any case do not concur in afterpulsing, for the reasons explained previously.

Figure 4:
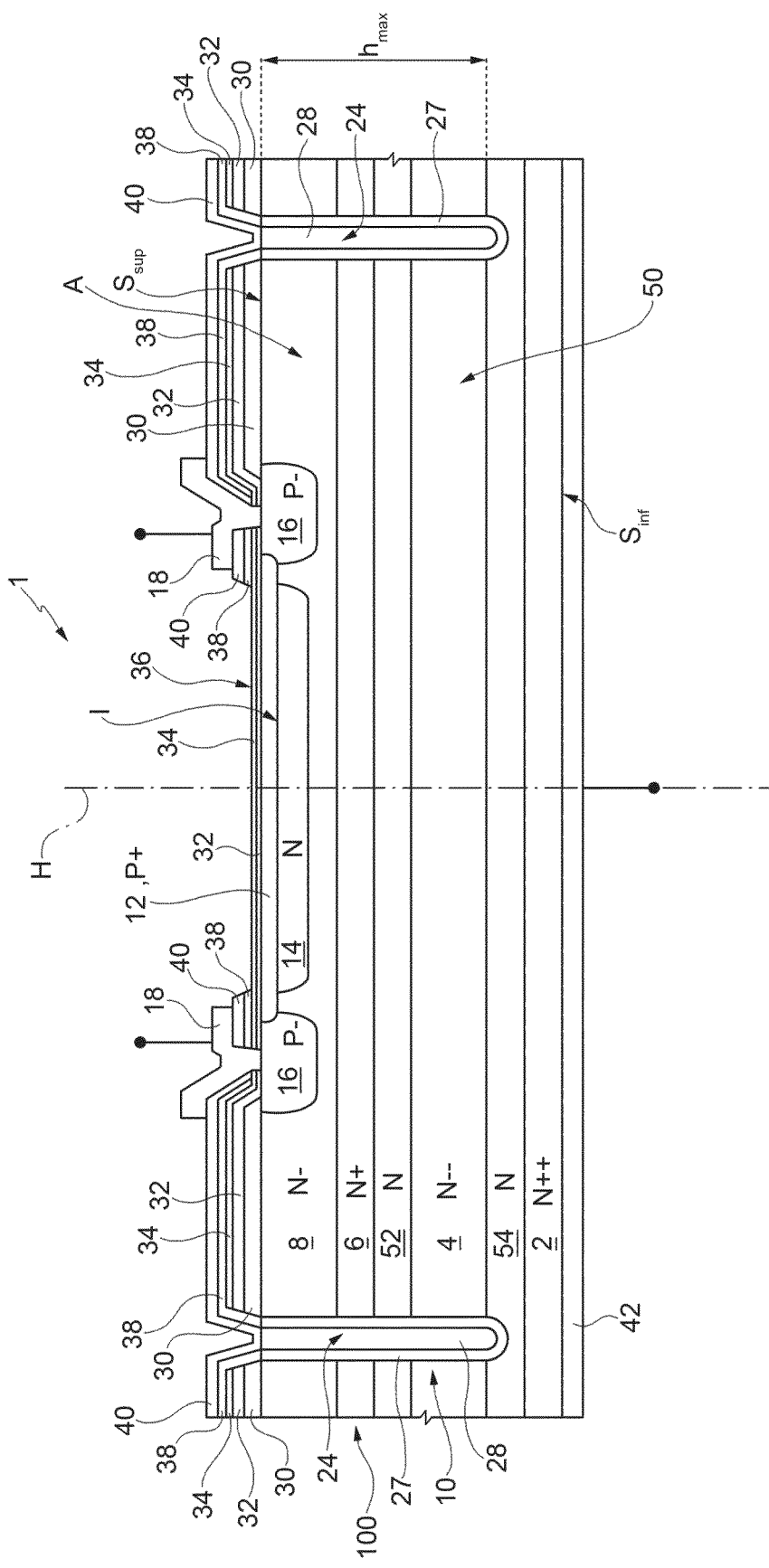

According to a different embodiment, illustrated in FIG. 4 and described with reference just to the differences with respect to the embodiment illustrated in FIG. 1, the semiconductor body 10 comprises a fourth epitaxial layer 52 and a fifth epitaxial layer 54, each of which is of an N type, has a thickness comprised between 2 μm and 5 μm and has a doping level comprised, for example, between $1 \cdot 10^{15}$ cm$^{-3}$ and $1 \cdot 10^{16}$ cm$^{-3}$.

In greater detail, the fourth epitaxial layer 52 is arranged between the first and second epitaxial layers 4, 6. The fifth epitaxial layer 54 is arranged between the substrate 2 and the first epitaxial layer 4.

Figure 5:
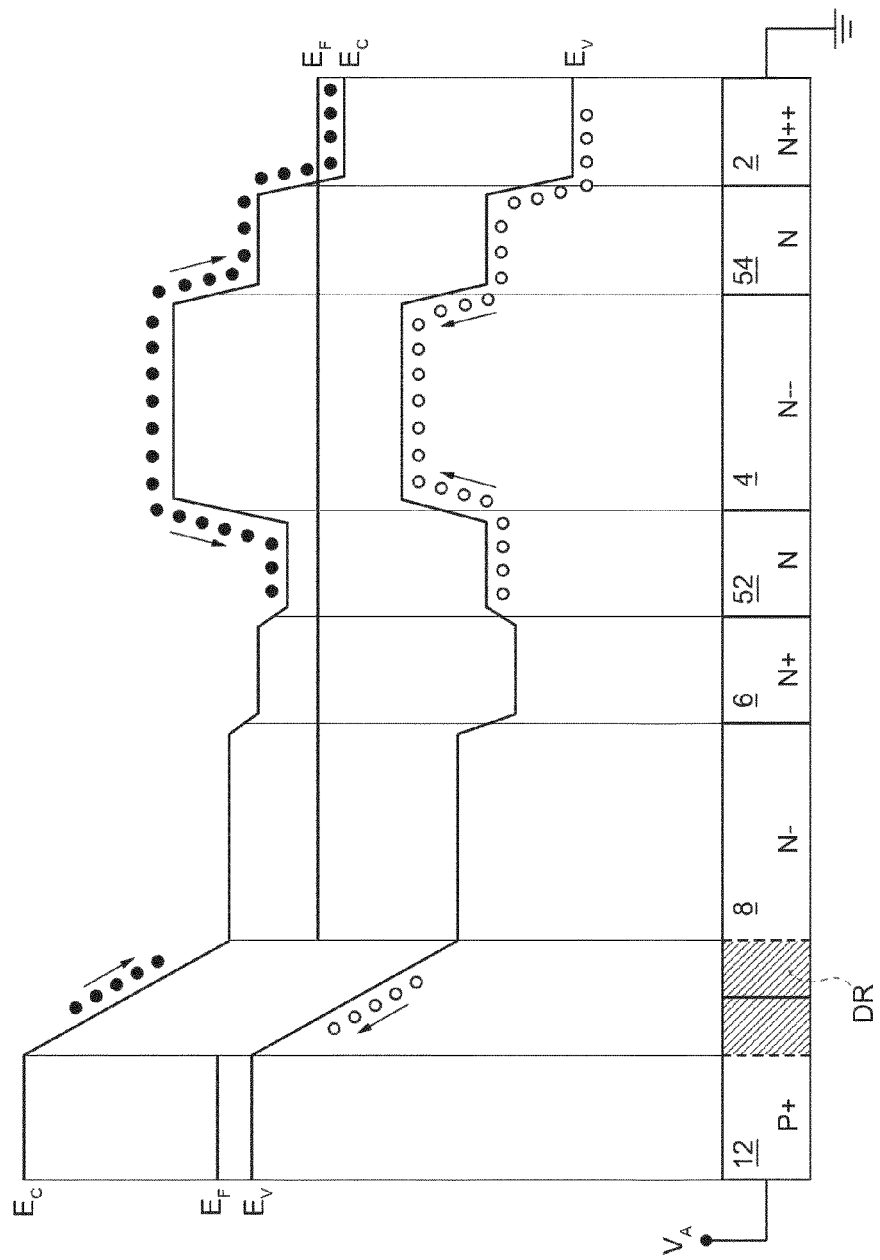

In practice, as illustrated in FIG. 5, where for simplicity of representation it is assumed that the enriched region 14 is absent, the band diagram of the semiconductor body 10 has a stepwise profile such that the first epitaxial layer 4 and the fourth and fifth epitaxial layers 52, 54 form a potential well for the holes. A region of large thickness is thus formed, which is able to facilitate thermalization of the holes, as well as confinement of the photons. Moreover, the fifth epitaxial layer 54 functions as buffer layer for matching the high doping level of the substrate 2 to the low doping level of the first epitaxial layer 4. Likewise, the fourth epitaxial layer 52 functions as buffer layer for matching the doping levels between the first and second epitaxial layers 4, 6.

According to further variants (not illustrated), further epitaxial layers may be present, in such a way that arranged between the substrate 2 and the first epitaxial layer 4 is a plurality of lower intermediate layers, having doping levels decreasing progressively in the direction of the first epitaxial layer 4. In this case, present between the first and second epitaxial layers 4, 6 is a plurality of upper intermediate layers, having doping levels progressively increasing in the direction of the second epitaxial layer 6. Each upper intermediate layer corresponds to a lower intermediate layer in such a way as to form a corresponding pair. The layers of each pair have, for example, thicknesses and doping levels that are substantially the same as one another and are arranged specular to one another with respect to the first epitaxial layer 4.

Figure 6:
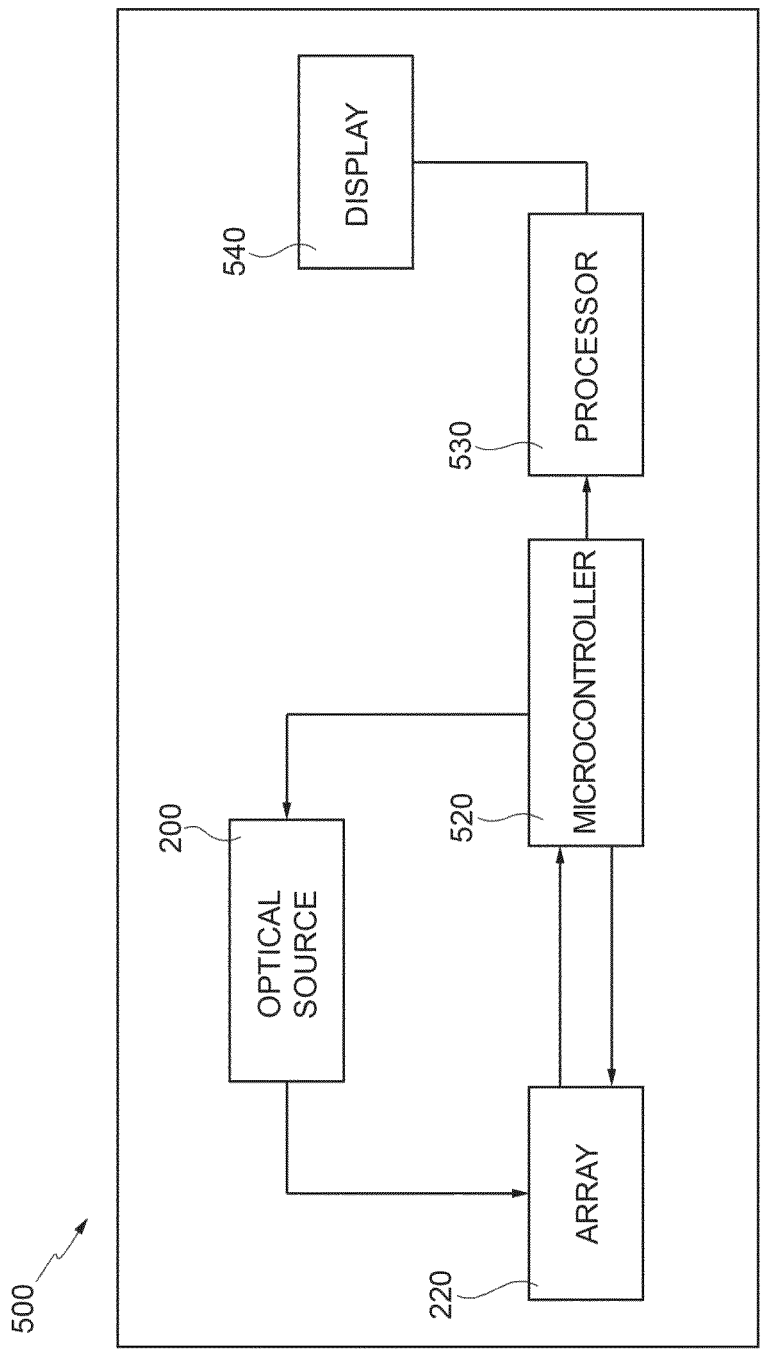
FIG. 6 shows a block diagram of a system that uses the array of photodiodes illustrated in FIG. 2.

The array 220 may be used in a generic detection system 500 illustrated in FIG. 6, where the light source 200 illuminates the array 220 and is controlled by a microcontroller unit 520, which is moreover connected to the array 220. The microcontroller unit 520 biases the photodiodes 1 of the array 220, processes the output signal of the array 220, and supplies a processed signal to a processor 530, which enables analysis of this processed signal and display of the information associated to said processed signal on a display 540.

The advantages that the present photodiode affords emerge clearly from the foregoing discussion.

In particular, the present photodiode has a structure that can be correctly biased using just two terminals and enables reduction of the phenomenon of delayed crosstalk, thanks to the presence of a structure for electro-optical confinement formed within the semiconductor body. The electro-optical confinement structure is in fact able to prevent the holes generated therein and the holes that, even though they have not been generated therein, arrive therein, from reaching the depleted region of the overlying PN junction. Moreover, the electro-optical coupling structure forms a waveguide capable of guiding secondary photons in the direction of the barrier region 28, preventing the latter from triggering spurious avalanche events within active areas of surrounding photodiodes.

Finally, it is evident that modifications and variations may be made to the photodiode described, without thereby departing from the scope of the present invention.

For example, the P and N types may be reversed, in which case a confinement of the electrons, instead of a confinement of the holes, is obtained. Moreover, the anode region 12, instead of facing the top surface $S_{sup}$, may be overlaid by a top region of an N type. In this case, the anode region 12 is obtained, for example, by ion implantation, and the first PN junction is at a depth greater than the depth indicated previously.

What is claimed is:

1. An avalanche photodiode, comprising:
   a body of semiconductor material having a first surface and a second surface, said body including:
      a cathode region of a first type of conductivity, forming the first and second surfaces; and
      an anode region of a second type of conductivity, extending within the cathode region and contacting the cathode region along an interface;
   a lateral insulating region extending through the body starting from the first surface and surrounding the anode region and at least part of the cathode region, said lateral insulating region comprising:
      a barrier region; and
      an insulating region which surrounds the barrier region; and wherein the cathode region forms an optical guide of a planar type comprising a core region which is arranged between the interface and the second surface and which extends between a minimum depth and a maximum depth and is designed to guide photons;
   wherein the barrier region extends with a thickness at least equal to said maximum depth so as to surround the core region laterally, the barrier region configured to prevent propagation beyond the barrier region of at least part of the photons coming, in use, from the core region and impinging upon the barrier region;
   wherein the core region forms an electrical-confinement region for minority carriers generated within the core region.

2. The photodiode according to claim 1, wherein the barrier region is made of metal material.

3. The photodiode according to claim 1, wherein the barrier region is made of optically absorbent material and is such as to absorb, in use, the photons coming from the core region, having wavelengths comprised between 700 nm and 1100 nm and impinging upon the barrier region with directions of propagation parallel to the second surface.

4. The photodiode according to claim 1, wherein the core region is delimited laterally by the insulating region with which it is in direct contact.

5. The photo diode according to claim 1, wherein the core region has a substantially constant thickness in a direction parallel to the second surface.

6. The photodiode according to claim 1, wherein said cathode region forms a top coating region and a bottom coating region arranged in contact with the core region, the top coating region being arranged between the core region and the first surface, the bottom coating region being arranged between the core region and the second surface, the core region having a refractive index higher than the refractive index of the top coating region and of the bottom coating region.

7. The photodiode according to claim 6, wherein said cathode region comprises a substrate and a first epitaxial layer and a second epitaxial layer, the first epitaxial layer being arranged between the substrate and the second epitaxial layer and having a doping level lower than the doping levels of the substrate and of the second epitaxial layer, the substrate and the second epitaxial layer forming the bottom coating region and the top coating region, respectively.

8. The photodiode according to claim 7, wherein said cathode region further comprises a third epitaxial layer overlying the second epitaxial layer and an enriched region extending within the third epitaxial layer in contact with the anode region, and wherein the third epitaxial layer has a doping level lower than the doping levels of the second epitaxial layer and of the enriched region.

9. The photodiode according to claim 6, wherein said cathode region comprises a substrate and a first epitaxial layer and a second epitaxial layer, the first epitaxial layer being arranged, at a distance, between the substrate and the second epitaxial layer; and wherein the top coating region is arranged between the first and second epitaxial layers, and the bottom coating region is arranged between the substrate and the first epitaxial layer, the first epitaxial layer having a doping level lower than the doping levels of the top coating region and of the bottom coating region, the substrate and the second epitaxial layer having doping levels higher than the doping levels of the top coating region and of the bottom coating region in such a way that the first epitaxial layer, the top coating region and the bottom coating region form an electrical-confinement region for minority carriers generated within the first epitaxial layer, of the top coating region and of the bottom coating region.

10. The photodiode according to claim 9, wherein said cathode region further comprises an enriched region and a third epitaxial layer, a fourth epitaxial layer, and a fifth epitaxial layer, the third epitaxial layer having a doping level lower than the doping level of the second epitaxial layer and overlying, in direct contact, the second epitaxial layer, the enriched region extending within the third epitaxial layer in contact with the anode region; and wherein the fourth epitaxial layer is arranged between the first and second epitaxial layers and forms the top coating region, and the fifth epitaxial layer is arranged between the substrate and the first epitaxial layer and forms the bottom coating region.

11. The photodiode according to claim 1, wherein the anode region faces the first surface.

12. The photodiode according to claim 1, further comprising a guard ring of the second type of conductivity, extending outside the anode region, in direct contact with the anode region and with the cathode region, said guard ring having a doping level lower than the doping level of the anode region.

13. An apparatus, comprising an array of photodiodes, each photodiode comprising:
a body of semiconductor material having a first surface and a second surface, said body including:
a cathode region of a first type of conductivity, forming the first and second surfaces; and
an anode region of a second type of conductivity, extending within the cathode region and contacting the cathode region along an interface;
a lateral insulating region extending through the body starting from the first surface and surrounding the anode region and at least part of the cathode region, said lateral insulating region comprising:
a barrier region; and
an insulating region which surrounds the barrier region; and
wherein the cathode region forms an optical guide of a planar type comprising a core region which is arranged between the interface and the second surface and which extends between a minimum depth and a maximum depth and is designed to guide photons;
wherein the barrier region extends with a thickness at least equal to said maximum depth so as to surround the core region laterally, the barrier region configured to prevent propagation beyond the barrier region of at least part of the photons coming, in use, from the core region and impinging upon the barrier region;
wherein the core region forms an electrical-confinement region for minority carriers generated within the core region.

14. The apparatus of claim 13, further comprising:
a light source optically coupled to the array; and
a processing unit electrically coupled to the array and configured to detect photons.

15. An integrated circuit, comprising:
a cathode region of a first type of conductivity;
an anode region of a second type of conductivity in contact with the cathode region;
said cathode and anode forming an avalanche photodiode;
wherein the cathode region includes, underneath the anode region, a planar optical waveguide configured to guide photons generated in response actuation of the avalanche photodiode; and
an insulating region formed in the cathode region surrounding the anode region and passing through the planar optical waveguide, said insulating region configured to prevent propagation of said photons beyond said insulating region.

16. The circuit of claim 15, wherein the surrounding insulating region defines a core region within which minority carriers produced in response actuation of the avalanche photodiode are electrically confined.

17. The circuit of claim 15 wherein the cathode region is formed of a plurality of epitaxial layers of the first type of conductivity, and wherein said planar optical waveguide is formed by one of said plurality of epitaxial layers.

18. The circuit of claim 17, wherein the plurality of epitaxial layers comprise a first epitaxial layer, a second epitaxial layer and a third epitaxial layer, wherein the second epitaxial layer positioned between the first and third epitaxial layers forms the planar optical waveguide, and wherein the first and third epitaxial layers are more highly doped than the second epitaxial layer.

19. The circuit of claim 15, wherein the insulating region comprises:
a trench surrounding the anode region and extending into said cathode region;
a liner formed on walls of the trench; and
a fill material filling the lined trench.

20. The circuit of claim 19, wherein the liner comprises a dielectric and the fill material comprises doped polysilicon.

21. The circuit of claim 17, wherein the plurality of epitaxial layers comprise a first epitaxial layer, a second epitaxial layer and a third epitaxial layer, wherein the second epitaxial layer positioned between the first and third epitaxial layers forms the planar optical waveguide, and wherein the trench passes completely through the first and second epitaxial layers but does not pass completely through the third epitaxial layer.

* * * * *